United States Patent
Cai et al.

(10) Patent No.: US 8,551,843 B1
(45) Date of Patent: Oct. 8, 2013

(54) METHODS OF FORMING CMOS SEMICONDUCTOR DEVICES

(75) Inventors: Xiuyu Cai, Albany, NY (US); Ruilong Xie, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1 day.

(21) Appl. No.: 13/465,486

(22) Filed: May 7, 2012

(51) Int. Cl.
*H01L 21/336* (2006.01)

(52) U.S. Cl.
USPC ....... 438/294; 438/717; 438/736; 257/E21.19

(58) Field of Classification Search
CPC .............................................. H01L 21/823878
USPC ........................... 438/199, 294, 692, 706, 717
See application file for complete search history.

(56) References Cited

U.S. PATENT DOCUMENTS 7,915,139 B1    3/2011  Lang et al.
2013/0102138 A1*  4/2013  Yeh et al. ...................... 438/585

* cited by examiner

*Primary Examiner* — Charles Garber
*Assistant Examiner* — Regan J Rundio
(74) *Attorney, Agent, or Firm* — Williams, Morgan & Amerson, P.C.

(57) ABSTRACT

One method disclosed herein includes forming first, second and third gate stacks, wherein one of the gate stacks is an isolation stack positioned above an isolation structure and each of the gate stacks is comprised of three layers of hard mask material positioned above a layer of gate electrode material. The method also involves forming sidewall spacers proximate the second gate stack while the first and isolation gate stacks are masked, forming sidewall spacers proximate the first gate stack while the second and isolation gate stacks are masked, forming a polish stop layer between the plurality of gate stacks, performing another etching process on an etch stop layer, a layer of spacer material, and the second layer of hard mask material positioned above or proximate the isolation gate stack and performing a chemical mechanical polishing process to remove material positioned above an upper surface of the polish stop layer.

18 Claims, 9 Drawing Sheets

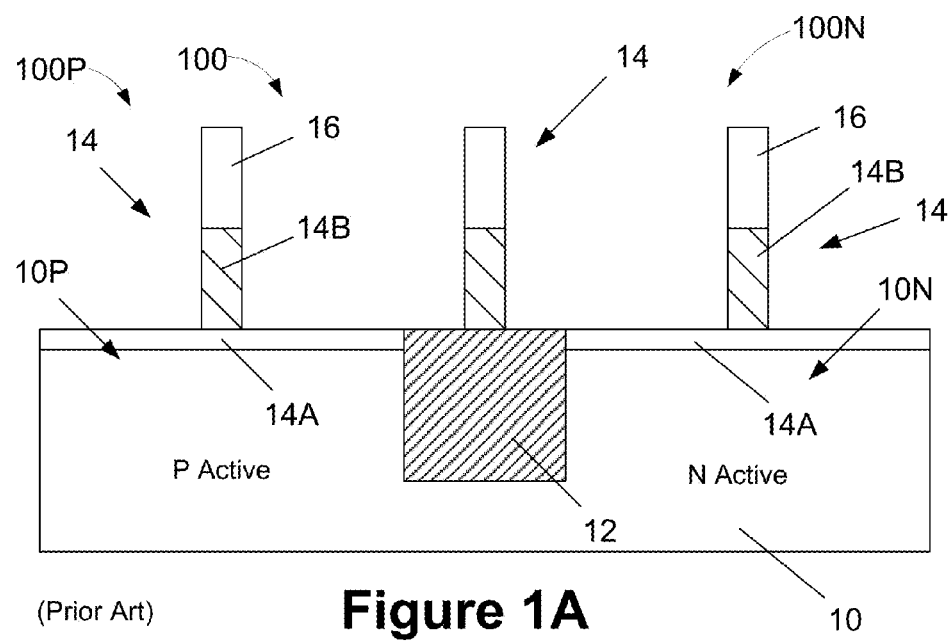
(Prior Art) Figure 1A
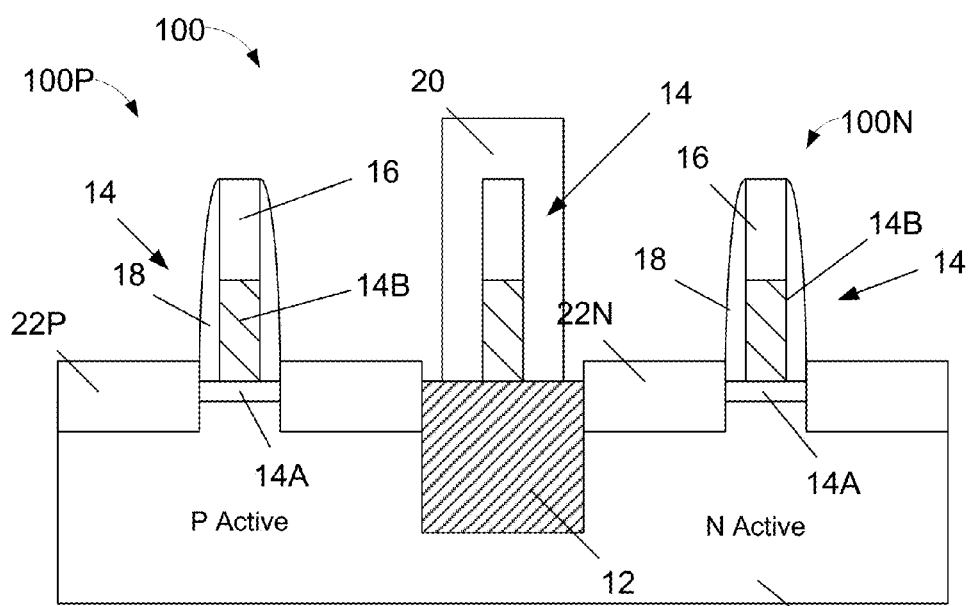
(Prior Art) Figure 1B

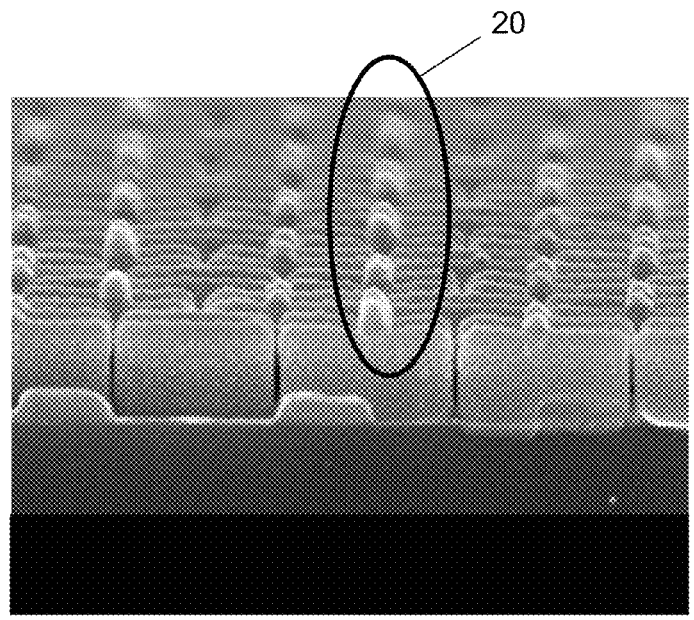
(Prior Art) Figure 1C
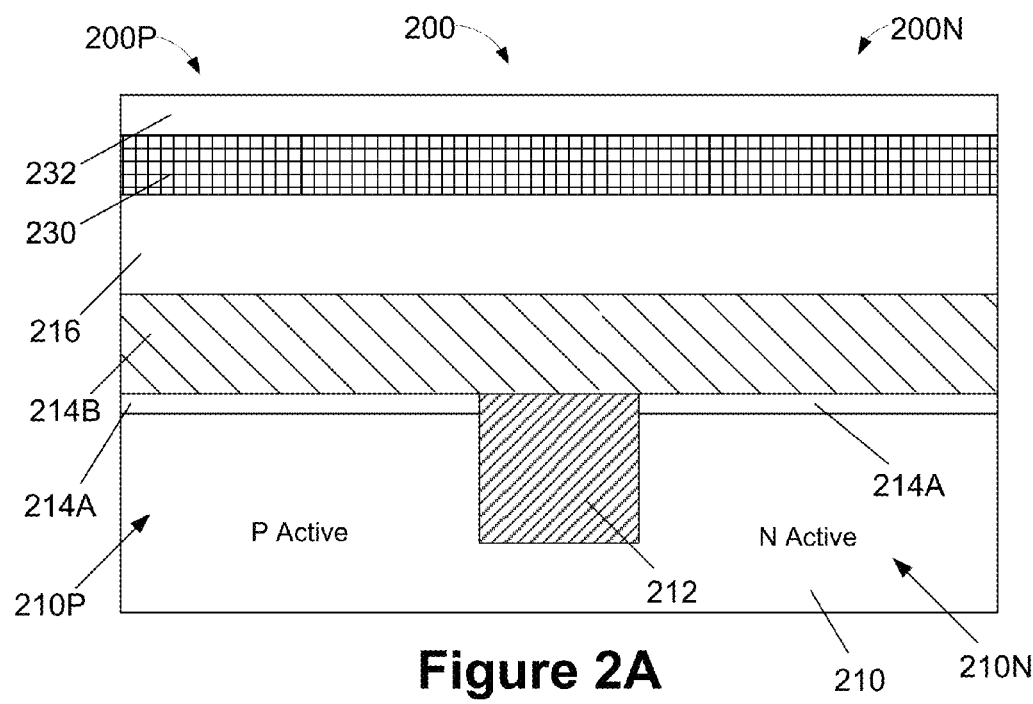
Figure 2A

METHODS OF FORMING CMOS SEMICONDUCTOR DEVICES

BACKGROUND OF THE INVENTION

1. Field of the Invention

Generally, the present disclosure relates to the manufacture of sophisticated semiconductor devices, and, more specifically, to various methods of forming CMOS based semiconductor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element that substantially determines performance of the integrated circuits. During the fabrication of complex integrated circuits using, for instance, CMOS technology, millions of transistors, e.g., NMOS transistors and/or PMOS transistors, are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed between the highly doped source/drain regions.

In a field effect transistor, the conductivity of the channel region, i.e., the drive current capability of the conductive channel, is controlled by a gate electrode formed adjacent to the channel region and separated therefrom by a thin gate insulation layer. The conductivity of the channel region, upon formation of a conductive channel due to the application of an appropriate control voltage to the gate electrode, depends upon, among other things, the dopant concentration, the mobility of the charge carriers and, for a given extension of the channel region in the transistor width direction, the distance between the source and drain regions, which is also referred to as the channel length of the transistor. Hence, in combination with the capability of rapidly creating a conductive channel below the insulating layer upon application of the control voltage to the gate electrode, the conductivity of the channel region substantially affects the performance of MOS transistors. Thus, since the speed of creating the channel, which depends in part on the conductivity of the gate electrode, and the channel resistivity substantially determine the characteristics of the transistor, the scaling of the channel length, and associated therewith the reduction of channel resistivity, are dominant design efforts used to increase the operating speed of the integrated circuits.

FIGS. 1A-1C depict one illustrative prior art process flow for forming a semiconductor device 100 that includes an illustrative PMOS transistor 100P and an illustrative NMOS transistor 100N. As shown in FIG. 1A, the process begins with the formation of a trench isolation structure 12 in a semiconducting substrate 10. The isolation region 12 defines a P-Active region 10P and an N-Active region 10N in the substrate 10. Next, illustrative gate electrode structures 14 for the PMOS transistor 100P and the NMOS transistor 100N are formed above the regions 10P, 10N and above the isolation region 12. The gate electrode structures 14 generally include a gate insulation layer 14A and one or more conductive gate electrode layers 14B. A gate cap layer 16, made of a material such as silicon nitride, is formed above the gate structures 14. The gate electrode structures 14 depicted herein are intended to be schematic and representative in nature, as the materials of construction used in the gate structures 14 may be different for the PMOS transistor 100P as compared to the NMOS transistor 100N, e.g., the PMOS transistor 100P may have multiple layers of conductive metal, etc. The gate insulation layer 14A may be comprised of a variety of materials, such as silicon dioxide, silicon oxynitride, a high-k (k value greater than 10) insulating material. The gate electrode layer 14B may be comprised of one or more layers of conductive materials, such as polysilicon, a metal, etc. The structure depicted in FIG. 1A may be formed by a performing a variety of known techniques. For example, the layers of material that make up the gate insulation layer 14A, the gate electrode layer 14B and the gate cap layer 16 may be blanket-deposited above the substrate 10 and, thereafter, one or more etching processes are performed through a patterned mask layer (not shown) to define the basic gate structures 14 depicted in FIG. 1A.

FIG. 1B depicts the device 100 after several process operations have been performed. More specifically, illustrative silicon nitride spacers 18 have been formed adjacent the gate structures 14 for both the PMOS transistor 100P and the NMOS transistor 100N. The spacers 20 are typically formed by depositing a layer of spacer material and thereafter performing an anisotropic etching process. Also depicted in FIG. 1B are illustrative raised source/drain regions 22P, 22N. In general, although the raised source/drain regions 22P, 22N are formed at different times, each of them may be formed by forming cavities in the substrate 10 of the appropriate gate stack and thereafter performing one or more epitaxial growth processes to grow a semiconductor material, such as silicon/germanium or silicon/carbon in the cavities. The raised source/drain regions 22P, 22N are typically doped with an appropriate dopant material at the time the semiconductor material is formed, i.e., an in situ doping process.

To form the structure depicted in FIG. 1B, a series of masking steps are performed to expose one of the active regions, e.g., the P-active region 10P, while covering the other active region, e.g., the N-active region 10N. This masking process is required because the different devices, i.e., the PMOS transistor 100P and the NMOS transistor 100N, are comprised of different materials and each may be manufactured using slightly different techniques. Several of these masking processes may be performed to form the device 100 depicted in FIG. 1B. For example, the NMOS device 100N may be masked when the sidewall spacers 18 are formed for the PMOS device 100P and, conversely, the PMOS device 100P may be masked when the sidewall spacers 18 are formed for the NMOS device 100N. Unfortunately, the area above the isolation region 12, including the gate structure 14 positioned thereabove, is typically masked during all of these various masking and etching processes. As a result, the overall height of the structure positioned above the isolation region 12 may be taller, and sometimes significantly taller, than the gate structures 14 of the adjacent transistor devices, which is more dominant for FinFET devices. These relatively tall structures are sometimes referred to as "bumps" within the industry. FIG. 1C is a picture of an integrated circuit device depicting the bumps 20 on a real-world device.

The presence of such bumps 20 can be problematic for several reasons. In general, with the very small devices that are being manufactured today, surface planarity is a very important aspect of device fabrication. Thus, the presence of such bumps causes a manufacturer to perform time-consuming and expensive process operations, such as one or more chemical mechanical polishing (CMP) operations, in an effort to remove such bumps 20. However, despite the best of efforts, performing such CMP processes may result in unacceptable levels of dishing, which may ultimately lead to variations in the thickness of the various gate electrode structures. Such variations may lead to the fabrication of integrated circuit products that have degraded performance capability and, in some cases, to the fabrication of products that do not meet performance specifications.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming CMOS based semiconductor devices. In one example, a method disclosed herein includes the steps of forming first, second and third gate stacks, wherein one of the gate stacks is an isolation stack positioned above an isolation structure and wherein each of the gate stacks is comprised of three layers of hard mask material positioned above a layer of gate electrode material. The method also involves forming sidewall spacers proximate the second gate stack while the first gate stack and the isolation gate stack are masked, forming sidewall spacers proximate the first gate stack while the second gate stack and the isolation gate stack are masked, forming a polish stop layer between the plurality of gate stacks, performing another etching process on an etch stop layer, a layer of spacer material, and the second layer of hard mask material positioned above or proximate the isolation gate stack, and performing at least one chemical mechanical polishing process to remove material positioned above an upper surface of the polish stop layer.

BRIEF DESCRIPTION OF THE DRAWINGS

The disclosure may be understood by reference to the following description taken in conjunction with the accompanying drawings, in which like reference numerals identify like elements, and in which:

FIGS. 1A-1C depict one illustrative prior art process flow for forming a CMOS semiconductor device.

Figure 2B:
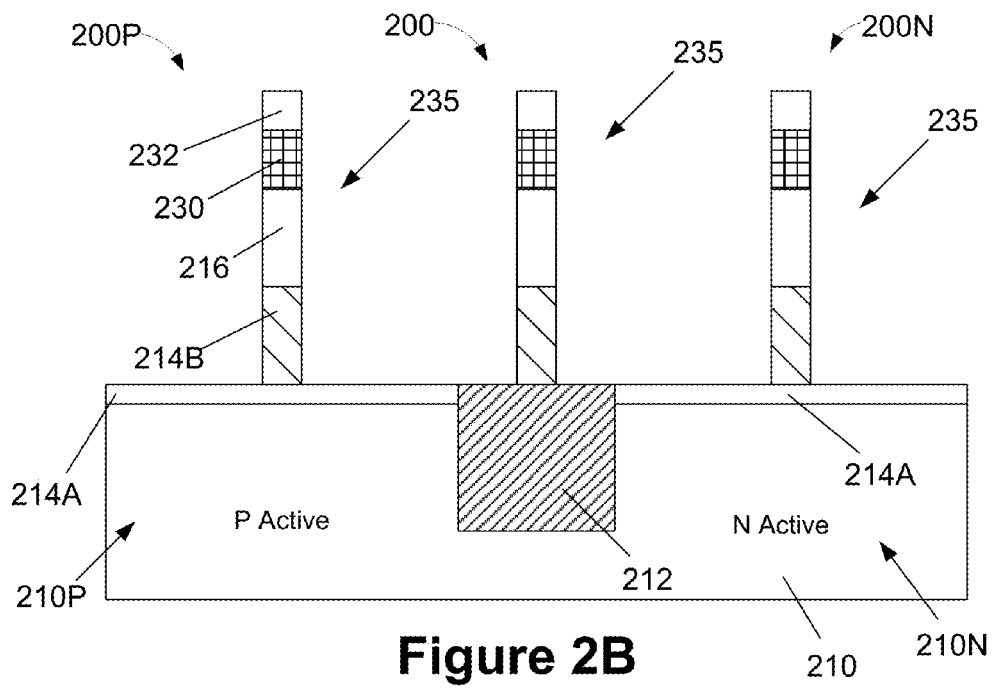
FIGS. 2A-2N depict various illustrative examples of using the methods disclosed herein to form CMOS semiconductor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming CMOS based semiconductor devices. Such a novel process flow may tend to reduce the undesirable recessing of the substrate, as discussed in the background section of this application. Moreover, such a novel process flow may tend to at least reduce some of the problems associated with the illustrative prior art process flow described previously. As will be readily apparent to those skilled in the art upon a complete reading of the present application, the present methods may be employed in manufacturing a variety of integrated circuit devices, including, but not limited to, logic devices, memory devices, ASICs, etc. With reference to the attached figures, various illustrative embodiments of the methods disclosed herein will now be described in more detail.

Figure 2C:
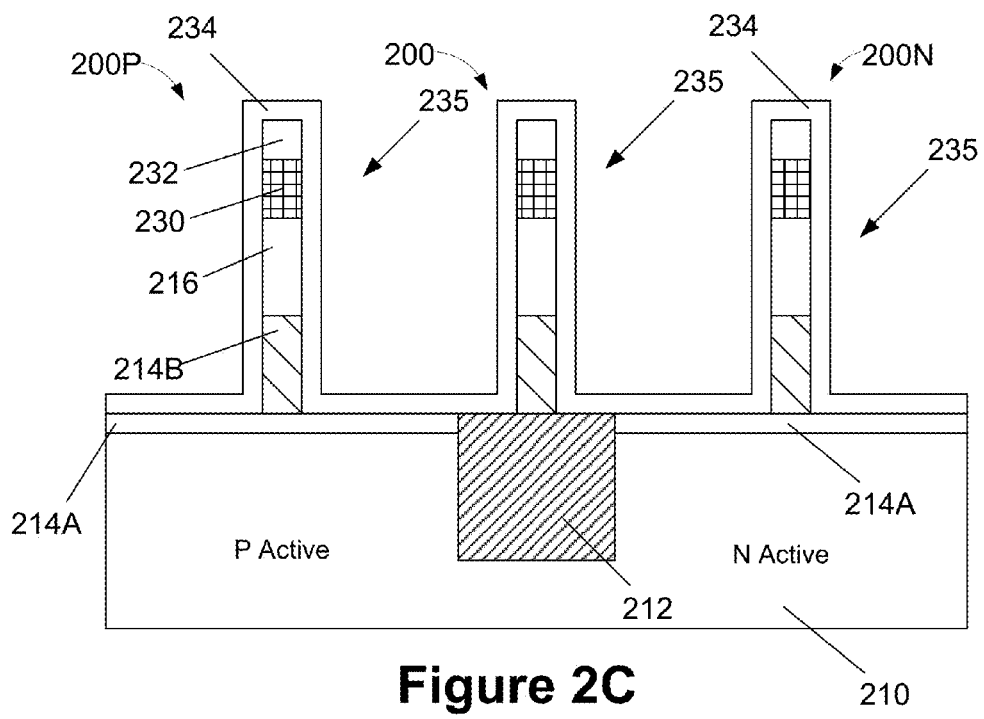
Figure 2D:
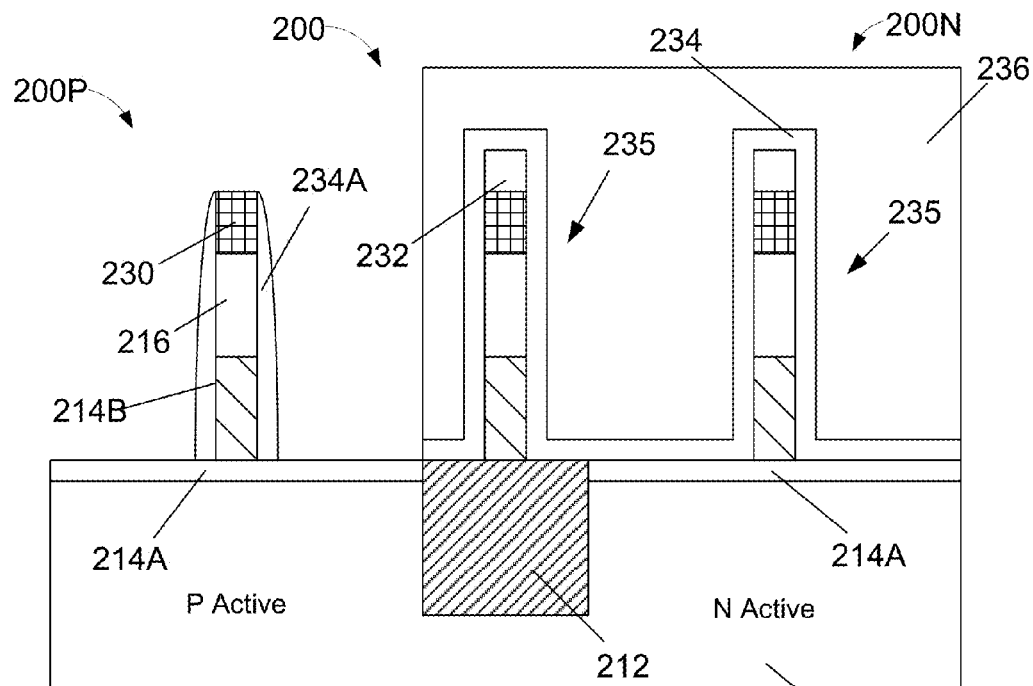
Figure 2E:
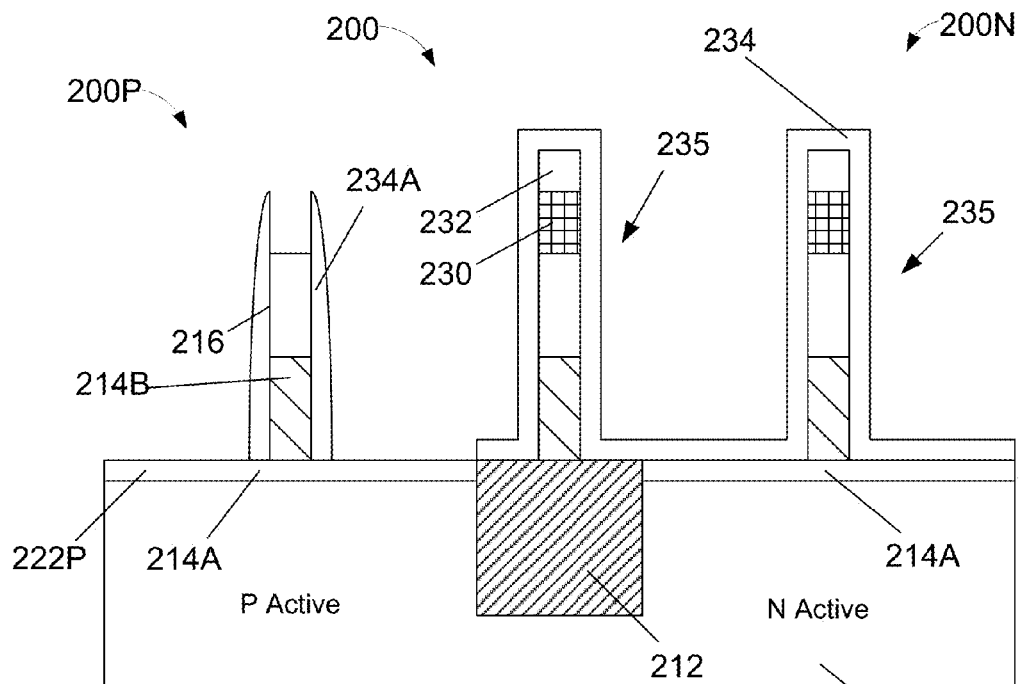
Figure 2F:
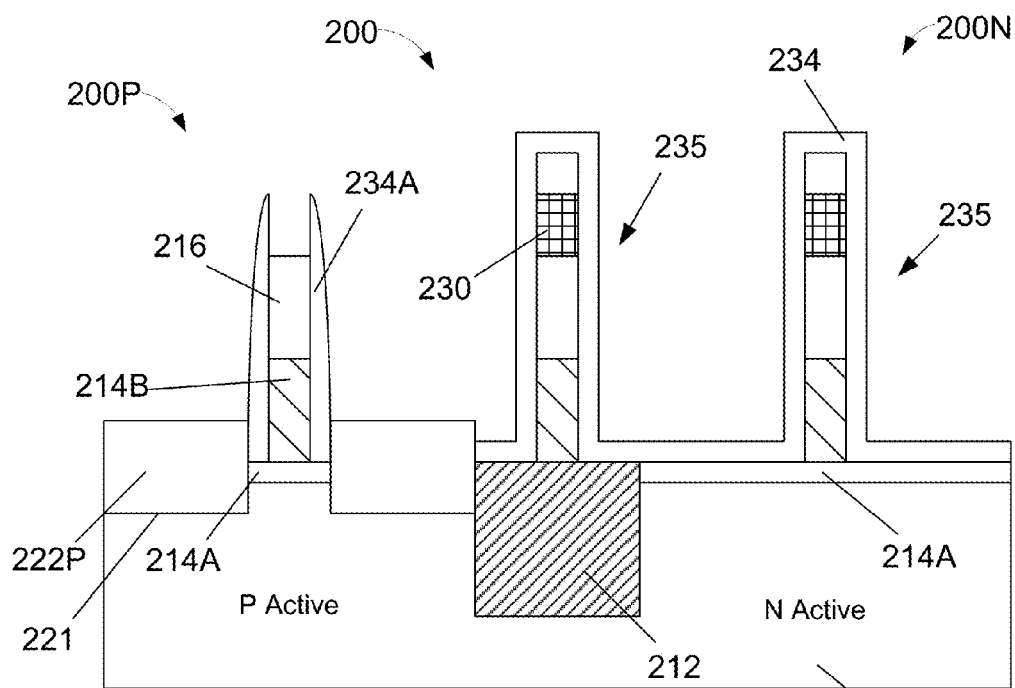
Figure 2G:
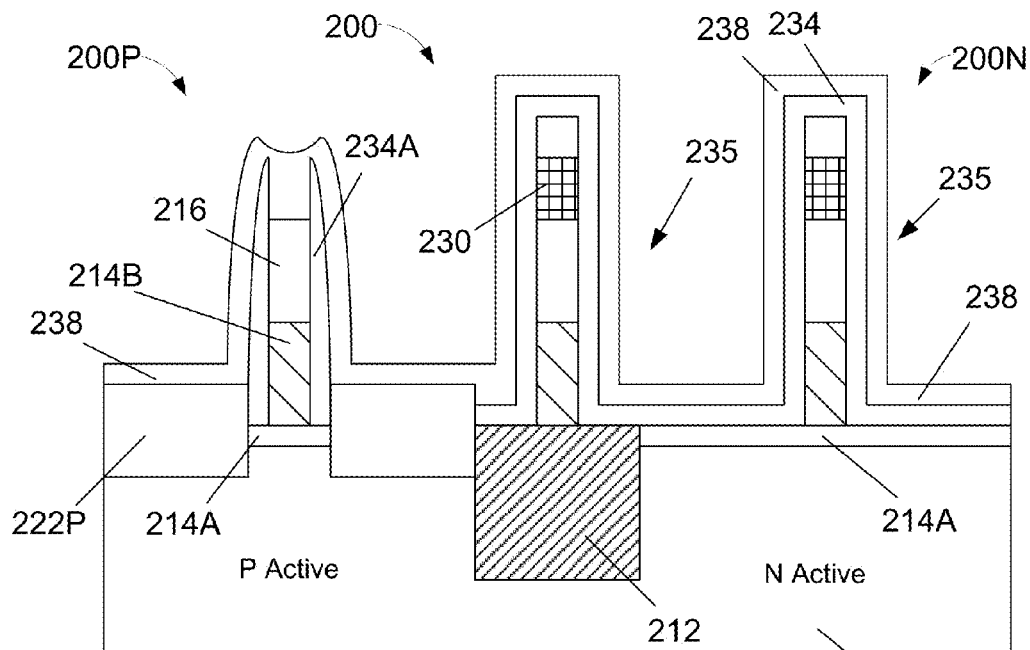
Figure 2H:
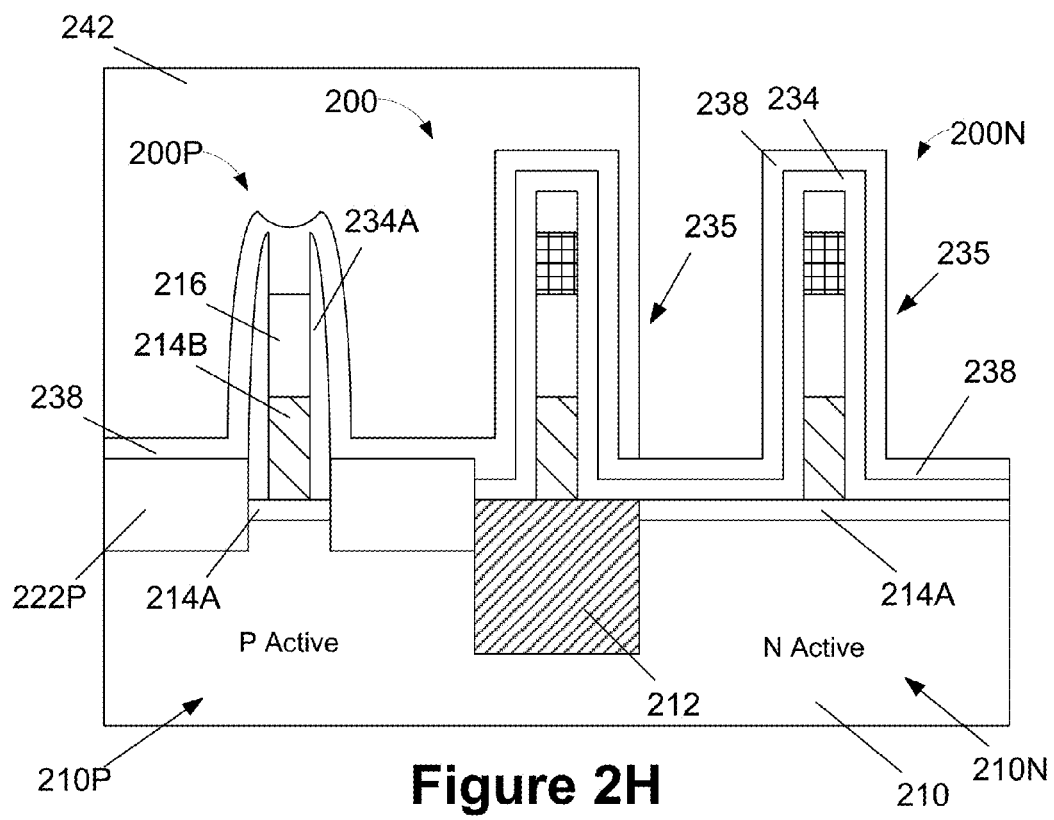
Figure 2I:
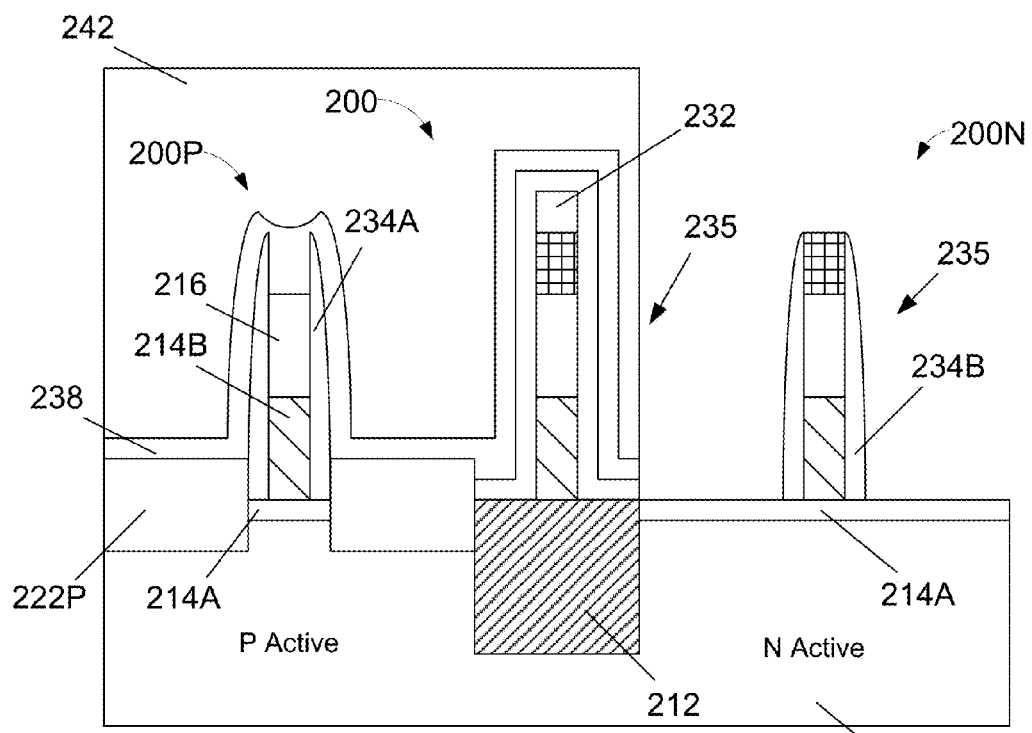
Figure 2J:
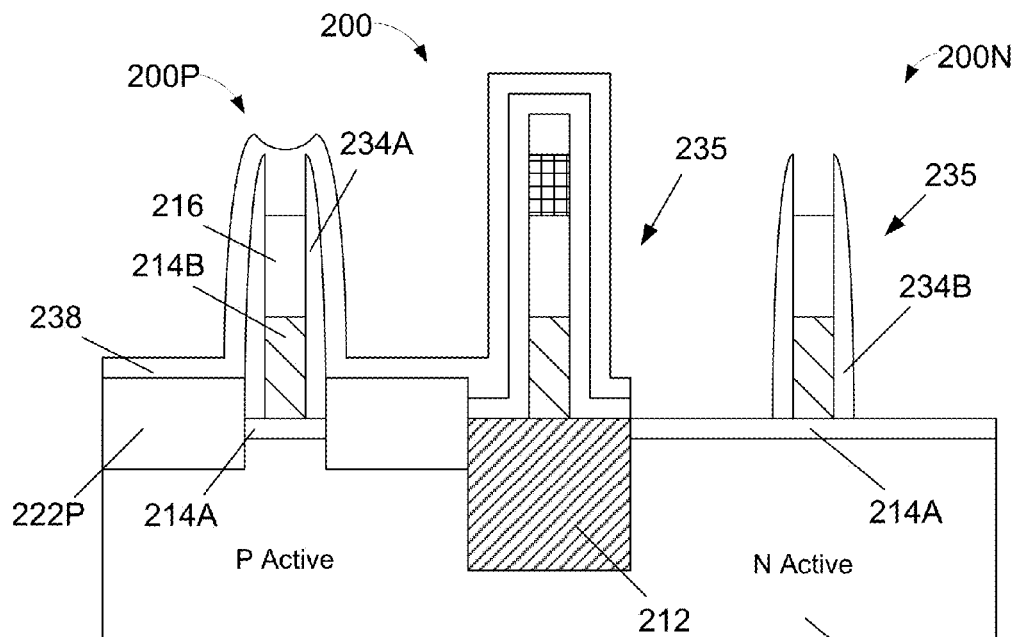
Figure 2K:
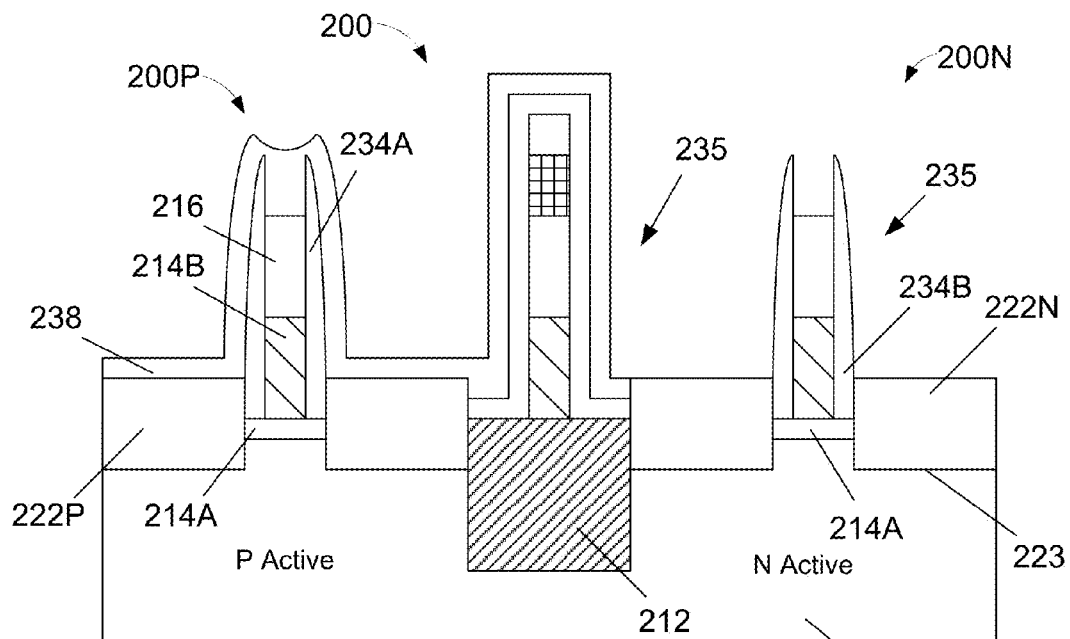
Figure 2L:
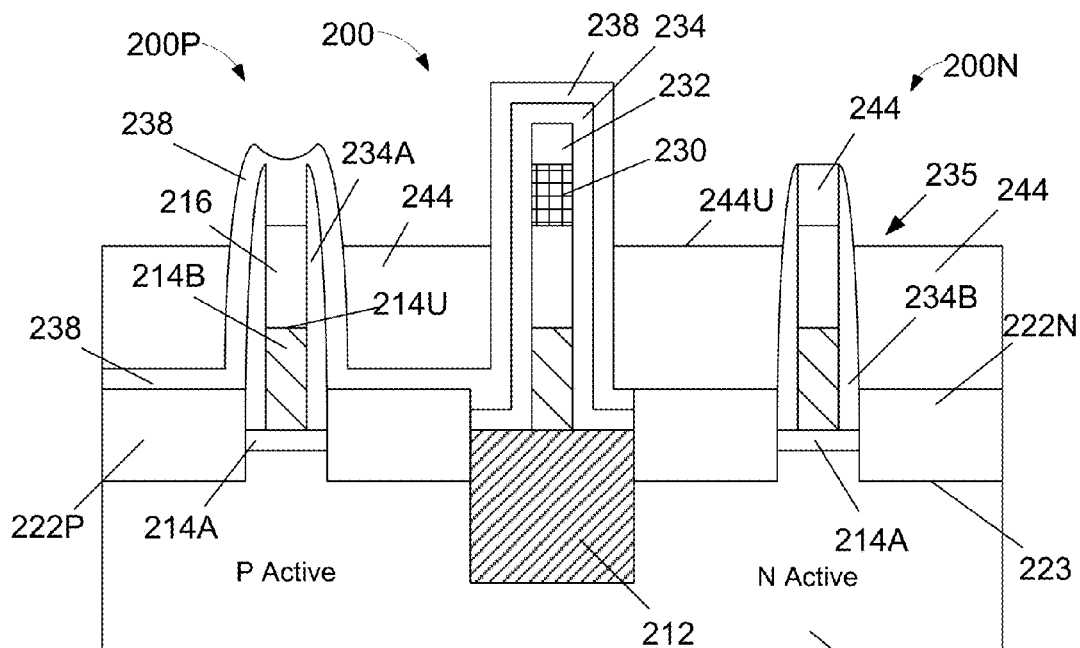
Figure 2M:
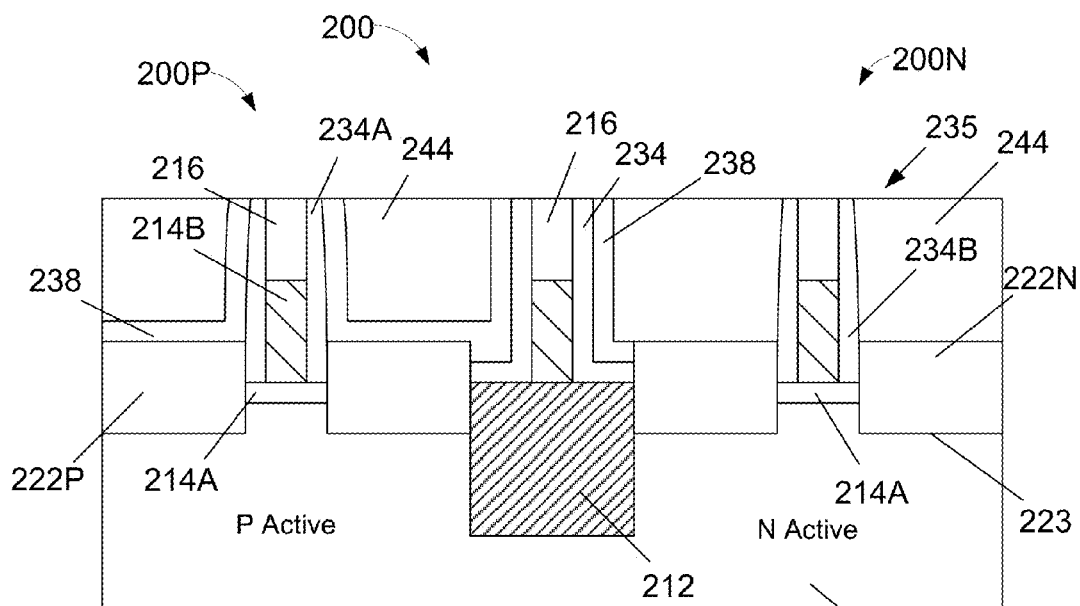
Figure 2N:
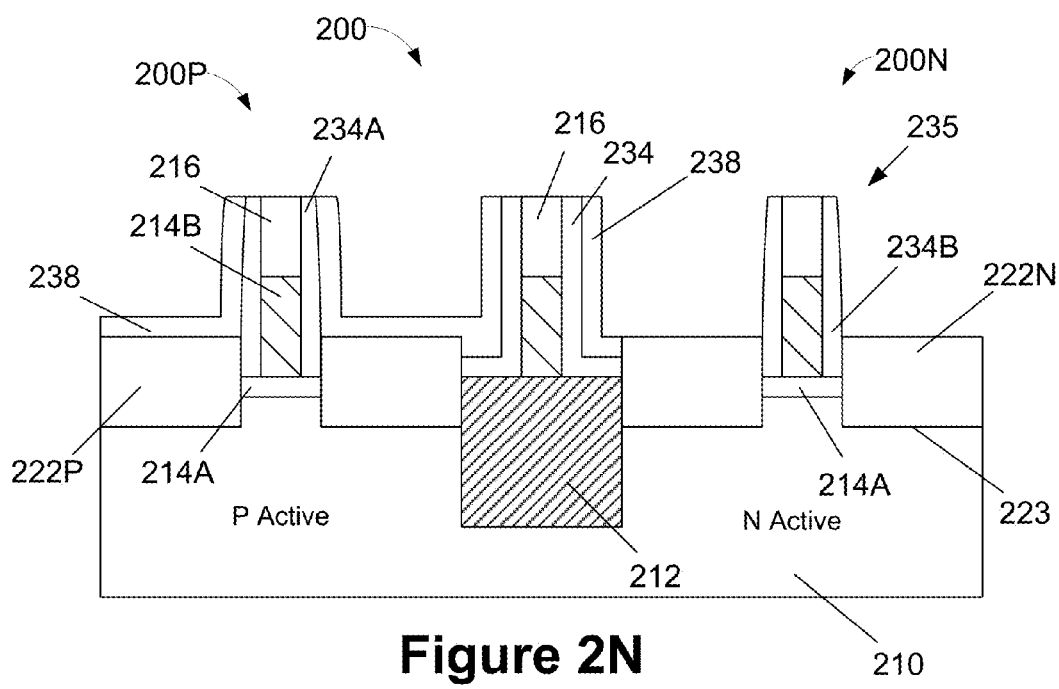

FIGS. 2A-2N depict one illustrative process flow for forming a CMOS based semiconductor device 200 that includes an illustrative PMOS transistor 200P and an illustrative NMOS transistor 200N. As shown in FIG. 2A, the process begins with the formation of an isolation structure 212 in a semiconducting substrate 210. Only a portion of the isolation structure 212 is depicted in the figures. The isolation structure 212 defines a P-Active region 210P and an N-Active region 210N in the substrate 210. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 210 may also be made of materials other than silicon.

Next, various layers of material are formed above the substrate 210 as part of the process of forming gate structures for the transistor devices. For example, in one illustrative embodiment, a gate insulation material layer 214A, a gate electrode material layer 214B, a first hard mask material layer 216, a second hard mask material layer 230 and a third hard mask material layer 232 are formed above the substrate. The above-mentioned material layers may be comprised of a variety of different materials, their thicknesses may vary depending upon the particular application and they may be formed by performing various known processes, e.g., a thermal growth process, a chemical vapor deposition (CVD) process, an atomic layer deposition (ALD) process, a physical vapor deposition (PVD) process, plasma-enhanced versions of such processes, etc. Thus, the particular materials used for the various material layers and the processes used to form such material layers should not be considered to be a limitation of the present inventions unless such limitations are expressly recited in the claims.

In one illustrative embodiment, the gate insulation material layer 214A and the gate electrode material layer 214B will ultimately be patterned to define gate structures comprised of a gate insulation layer 214A and a gate electrode 214B for the PMOS transistor 200P and the NMOS transistor 200N. The gate structures depicted herein are intended to be schematic and representative in nature, as the materials of construction used in the gate structures may be different for the PMOS transistor 200P as compared to the NMOS transistor 200N, e.g., the PMOS transistor 200P may have multiple layers of conductive metal, etc. The gate insulation layer 214A may be comprised of a variety of materials, such as silicon dioxide, silicon oxynitride, a high-k (k value greater than 10) insulating material. The gate electrode layer 214B may be comprised of one or more layers of conductive materials, such as polysilicon, a metal, etc. Thus, the particular details of construction of gate structures, and the manner in which the gate structures are formed, should not be considered a limitation of the present invention. For example, the gate structures may be made using so-called "gate-first" or "gate-last" techniques. That is, the gate insulation layer 214A and the gate electrode 214B may be sacrificial in nature and ultimately replaced with a final gate insulation layer/gate electrode, of they may be the final gate insulation layer/gate electrode for one or both the transistor devices 200P, 200N. In one illustrative embodiment, the gate insulation material layer 214A may be a layer of silicon dioxide that is formed by performing a thermal growth process, while the gate electrode material layer 214B may be a layer of polysilicon that is initially formed by performing a CVD process.

The various hard mask layers 216, 230, 232 may be comprised of a variety of different materials as well. For example, the first and third hard mask layer 216, 232 may be comprised of a material such as silicon nitride, silicon oxynitride, etc., and their thickness may vary depending upon the particular application. In some cases, the first and third hard mask layer 216, 232 may be comprised of the same material although that is not required to practice at least some aspects of the various inventions disclosed herein. In one illustrative embodiment, the first hard mask layer 216 may be a layer of silicon nitride having a thickness within the range of about 20-100 nm, while the third mask layer 232 may also be a layer of silicon nitride with a thickness of about 1-3 nm. In both cases, the first and third hard mask layers 216, 232 may be formed by performing a CVD process. The second hard mask layer 230 may be comprised of a variety of different materials as well. For example, the second hard mask layer 230 may be comprised of a carbon-based material such as a doped carbon, an undoped carbon, etc. and its thickness may vary depending upon the particular application. In one illustrative embodiment, the second hard mask layer 230 may be a layer of carbon having a thickness within the range of about 5-20 nm that may be formed by performing a CVD process. The reference to various material layers as the "first" or "third" layer, etc. in this specification is only a shorthand reference for purposes of identifying various structures and layers, and such shorthand references to the various material layers does not imply or suggest any particular sequence of formation of the layers of material or exclude the presence of intervening layers of material between the identified layers.

Next, as shown in FIG. 2B, one or more etching processes are performed through a patterned mask layer, e.g., a patterned photoresist mask (not shown) to define a plurality of material or gate stacks 235 positioned above the active regions 210P, 210N and the isolation structure 212. In this illustrative process flow, the gate insulation material layer 214A has not yet been patterned. The illustrative gate stack that is positioned above the P-active region 210P may be considered to be a PMOS gate stack, the gate stack positioned above the N-active region 210N may be considered to be an NMOS gate stack, while the gate stack positioned above the isolation structure 212 may be considered to be an isolation gate stack. At this point, using appropriate masking layers, various implantation processes may be performed to form halo implant regions (not shown) and extension implant regions (not shown) for both the PMOS transistor 200P and the NMOS transistor 200N. The implant regions may be formed in any order, i.e., the implant regions may be formed first on either the PMOS transistor 200P or the NMOS transistor 200N.

Then as shown in FIG. 2C, a layer of spacer material 234 is conformably deposited across the device 200. Ultimately, the layer of spacer material 234 will be used to form sidewall spacers adjacent gate structures for both the PMOS transistor 200P and the NMOS transistor 200N. The layer of spacer material 234 may be comprised of a variety of different materials, e.g., silicon nitride, silicon oxynitride, etc., and it may have a thickness of about 3-15 nm.

Next, as shown in FIG. 2D, in one illustrative process flow, a masking layer 236, e.g., a photoresist mask, is formed so as to cover the NMOS transistor 200N and substantially cover the isolation structure 212. The masking layer 236 exposes the P-active region 210P and the PMOS transistor 200P for further processing. In the example depicted herein, various process operations will be depicted as having first been performed on the PMOS transistor 200P prior to performing similar operations on the NMOS transistor 200N. However, as will be appreciated by one skilled in the art after a complete reading of the present application, the order could by reversed if desired. After the masking layer 236 is formed, an anisotropic etching process is performed on the layer of spacer material 234 to thereby define sidewall spacers 234A positioned adjacent the gate structure of the PMOS device 200P. Note that the etching process performed to form the sidewall spacers 234A also consumes the third masking layer 232 that was positioned above the gate structure for the PMOS device 200P, thereby exposing the second hard mask layer 230 in the P-active region 210P, while the second hard mask layer 230 acts as a very good etch stop layer (with minimal material consumption) during this etching process.

Then, as shown in FIG. 2E, one or more process operations are performed to remove the masking layer 236 and the second hard mask layer 230 from above the gate structure for the PMOS device 200P. The operations may be performed in any order or, depending on the technique, both of these layers of material may be removed at the same time. In one illustrative embodiment, the masking layer 236 is removed first by performing an ashing process and, thereafter, the second hard mask material 232 is easily removed by performing a wet etching process or RIE process. In general, in one embodiment, the second hard mask layer 230 may be made of a material that may be quickly and easily removed as compared to an alternative material, such as silicon nitride. The ease of removing the second hard mask material 230 facilitates the processing described herein.

Next, as shown in FIG. 2F, in one illustrative embodiment, raised source/drain regions 222P are formed for the PMOS device 200P. However, as will be appreciated by one skilled in the art after a complete reading of the present application, the various methods disclosed herein do not require the formation of such raised source/drain regions on either the PMOS device 200P or the NMOS device 200N to practice at least some aspects of the present invention. In general, when employed, the raised source/drain regions 222P may be formed by forming cavities 221 in the substrate 210 proximate the gate structure of the PMOS device 200P. Thereafter, one or more epitaxial growth processes are performed to grow semiconductor material, such as silicon and/or silicon/germanium, in the cavities 221. The raised source/drain regions 222P are typically doped with an appropriate P-type dopant material at the time the semiconductor material is formed, i.e., an in situ doping process.

Then as shown in FIG. 2G, an etch stop layer 238 is conformably deposited across the device 200. The etch stop layer 238 may be comprised of a variety of different materials, e.g., silicon nitride, silicon oxynitride, etc., and it may have a thickness of about 1-3 nm. As will be discussed more fully below, the etch stop layer 238 serves to, among other things, protect the PMOS device 200P during the formation of raised source/drain regions for the NMOS device 200N.

Next, as shown in FIG. 2H, in one illustrative process flow, a masking layer 242, e.g., a photoresist mask, is formed so as to cover the PMOS transistor 200P and substantially cover the isolation structure 212. The masking layer 242 exposes the N-active region 210N and the NMOS transistor 200N for further processing. As noted previously, in the example depicted herein, various process operations have been depicted as having first been performed on the PMOS transistor 200P prior to performing similar operations on the NMOS transistor 200N. However, as will be appreciated by one skilled in the art after a complete reading of the present application, the order could be reversed if desired.

Then, as shown in FIG. 2I, one or more anisotropic etching processes are performed on the etch stop layer 238 and the layer of spacer material 234 in the N-active region 210N. The etching process(es) result in the definition of sidewall spacers 234B positioned adjacent the gate structure of the NMOS device 200N. Note that the etching process performed to form the sidewall spacers 234B also consumes the third masking layer 232 that was positioned above the gate structure for the NMOS device 200N, thereby exposing the second hard mask layer 230 in the N-active region 210N, while the second hard mask layer 230 acts as a very good etch stop layer (with minimal material consumption) during this etching process.

Then, as shown in FIG. 2J, one or more process operations are performed to remove the masking layer 242 and the second hard mask layer 230 from above the gate structure for the NMOS device 200N. The operations may be performed in any order or, depending on the technique, both of these layers of material may be removed at the same time. In one illustrative embodiment, the masking layer 242 is removed first by performing an ashing process and, thereafter, the second hard mask material 230 is removed by performing a wet etching process using pirana as the etchant. In general, in one embodiment, the second hard mask layer 230 may be made of a material that may be quickly and easily removed as compared to an alternative material, such as silicon nitride. The ease of removing the second hard mask material 230 facilitates the processing described herein.

Next, as shown in FIG. 2K, in one illustrative embodiment, raised source/drain regions 222N are formed for the NMOS device 200N. However, as noted previously, the various methods disclosed herein do not require the formation of such raised source/drain regions on either the PMOS device 200P or the NMOS device 200N to practice at least some aspects of the present invention. In general, when employed, the raised source/drain regions 222N may be formed by forming cavities 223 in the substrate 210 proximate the gate structure of the NMOS device 200N. Thereafter, one or more epitaxial growth processes are performed to grow semiconductor material, such as silicon and/or silicon/carbon, in the cavities 223. The raised source/drain regions 222N are typically doped with an appropriate N-type dopant material at the time the semiconductor material is formed, i.e., an in situ doping process.

Next, as shown in FIG. 2L a polish stop layer 244 is formed on the device 200. In one illustrative embodiment, the polish stop layer 244 is comprised of a flowable oxide material. In a more specific example, the flowable oxide material may be deposited to the desired thickness by using a relatively new Novellus flowable oxide process, wherein at least some aspects of the aforementioned Novellus process are believed to be disclosed in U.S. Pat. No. 7,915,139, which is hereby incorporated by reference in its entirety. In general, the Novellus process is a relatively low-temperature process whereby the precursor material used in the process flows to the lowest level in the structure—in this case the regions between adjacent gate structures. The parameters of the deposition process, such as the length of the deposition process, determine the final thickness of the flowable oxide material. In one illustrative embodiment, the upper surface 244U of the polish stop layer 244 is positioned above the upper surface 214U of the gate electrode 214B in each of the gate stacks.

FIG. 2M depicts the device 200 after several process operations have been performed. First, one or more etching processes are performed on the device 200 to remove at least some of the portions of the etch stop layer 238, the spacer layer 234, the third hard mask layer 232 and the second mask material 230 that are positioned above the upper surface of the polish stop layer 244 using illustrative etching processes described above for removing those materials. Then, one or more CMP processes are performed to planarize the upper surface of the various material layers and structures formed above the substrate 210 using the polish stop layer 244 to stop the CMP process.

Next, as shown in FIG. 2N, the polish stop layer 244 is removed from the device by performing an etching or stripping process. In the illustrative example where the polish stop layer 244 is made of flowable oxide material, it may be removed by performing a wet or dry etching process (e.g., SiCoNi or COR) using an HF based etch chemistry. At the point of fabrication depicted in FIG. 2N, additional process operations may be performed on the device 200 to complete its fabrication, e.g., if applicable, removing a sacrificial gate structure and replacing it with a final or replacement gate structure, the formation of various conductive contact structures to various regions of the device, the formation of various wiring layers in layers of insulating material positioned above the device 200, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming first, second and third gate stacks, said first and second gate stacks being positioned above separated active regions in a semiconducting substrate, said third gate stack being an isolation stack positioned above an isolation structure formed in said semiconducting substrate, wherein each of said gate stacks is comprised of at least a layer of gate electrode material, a first layer of hard mask material positioned above said layer of gate electrode material, a second layer of hard mask material positioned above said first layer of hard mask material and a third layer of hard mask material positioned above said second layer of hard mask material, wherein said second layer of hard mask material is comprised of a material that may be selectively etched relative to said first and third layers of hard mask material;
    with said first gate stack and said isolation gate stack masked, performing a first etching process on a layer of spacer material to form sidewall spacers positioned proximate said second gate stack;
    after forming said sidewall spacers, performing a second etching process to remove said second layer of hard mask material in said second gate stack, thereby exposing said first layer of hard mask material in said second gate stack;
    forming an etch stop layer above said first gate stack, said second gate stack and said isolation gate stack;
    with said second gate stack and said isolation gate stack masked, performing at least one third etching process on said etch stop layer and on said layer of spacer material to form sidewall spacers positioned proximate said first gate stack, said at least one third etching process exposing said second layer of hard mask material in said first gate stack;
    performing a fourth etching process to remove said second layer of hard mask material in said first gate stack, thereby exposing said first layer of hard mask material in said first gate stack;
    forming a polish stop layer between said plurality of gate stacks, an upper surface of said polish stop layer being positioned at a level that is above a level of an upper surface of said layer of gate electrode material in each of said gate stacks;
    performing at least one fifth etching process on said etch stop layer, said layer of spacer material, and said second layer of hard mask material positioned above or proximate said isolation gate stack, said at least one fifth etching process exposing said first layer of hard mask material in said isolation gate stack; and
    performing at least one chemical mechanical polishing process to remove material positioned above said upper surface of said polish stop layer.

2. The method of claim 1, further comprising removing said polish stop layer.

3. The method of claim 1, wherein said polish stop layer is comprised of a flowable oxide material.

4. The method of claim 1, wherein said first gate stack is a gate stack for an NMOS transistor and said second gate stack is a gate stack for a PMOS transistor.

5. The method of claim 1, wherein said first gate stack is a gate stack for a PMOS transistor and said second gate stack is a gate stack for an NMOS transistor.

6. The method of claim 1, wherein said first and third layers of hard mask material are comprised of silicon nitride and said second layer of hard mask material is comprised of a carbon-based material.

7. The method of claim 6, wherein said carbon-based material is one of undoped carbon or a doped carbon.

8. A method, comprising:
    forming first, second and third gate stacks, said first and second gate stacks being positioned above separated active regions in a semiconducting substrate, said third gate stack being an isolation stack positioned above an isolation structure formed in said semiconducting substrate, wherein each of said gate stacks is comprised of at least a layer of gate electrode material, a first hard mask layer comprised of silicon nitride positioned above said layer of gate electrode material, a second hard mask layer comprised of a carbon-based material positioned above said first hard mask layer and a third hard mask layer comprised of silicon nitride positioned above said second hard mask layer;
    with said first gate stack and said isolation gate stack masked, performing a first etching process on a layer of spacer material to form sidewall spacers positioned proximate said second gate stack;
    after forming said sidewall spacers, performing a second etching process to remove said second hard mask layer in said second gate stack, thereby exposing said first hard mask layer in said second gate stack;
    forming an etch stop layer above said first gate stack, said second gate stack and said isolation gate stack;
    with said second gate stack and said isolation gate stack masked, performing at least one third etching process on said etch stop layer and on said layer of spacer material to form sidewall spacers positioned proximate said first gate stack, said at least one third etching process exposing said second hard mask layer in said first gate stack;
    performing a fourth etching process to remove said second hard mask layer in said first gate stack, thereby exposing said first hard mask layer in said first gate stack;
    forming a polish stop layer between said plurality of gate stacks, an upper surface of said polish stop layer being positioned at a level that is above a level of an upper surface of said layer of gate electrode material in each of said gate stacks;
    performing at least one fifth etching process on said etch stop layer, said layer of spacer material, and said second hard mask layer positioned above or proximate said isolation gate stack, said at least one fifth etching process exposing said first hard mask layer in said isolation gate stack; and
    performing at least one chemical mechanical polishing process to remove material positioned above said upper surface of said polish stop layer.

9. The method of claim 8, further comprising removing said polish stop layer.

10. The method of claim 8, wherein said first gate stack is a gate stack for an NMOS transistor and said second gate stack is a gate stack for a PMOS transistor.

11. The method of claim 8, wherein said first gate stack is a gate stack for a PMOS transistor and said second gate stack is a gate stack for an NMOS transistor.

12. The method of claim 8, wherein said carbon-based material is one of undoped carbon or a doped carbon.

13. A method, comprising:
- forming an isolation structure in a semiconducting substrate, said isolation structure dividing said substrate into separated active regions;
- performing at least one etching process on a stack of materials to define a first gate stack positioned above one of said active regions, a second gate stack positioned above the other of said active regions and an isolation gate stack positioned above said isolation structure, wherein each of said gate stacks is comprised of at least a layer of gate electrode material, a first layer of hard mask material positioned above said layer of gate electrode material, a second layer of hard mask material positioned above said first layer of hard mask material and a third layer of hard mask material positioned above said second layer of hard mask material, wherein said second layer of hard mask material is comprised of a material that may be selectively etched relative to said first and third layers of hard mask material;
- forming a layer of spacer material above said first gate stack, said second gate stack and said isolation gate stack;
- forming a first masking layer above said isolation gate stack and said first gate stack, said first masking layer exposing said second gate stack for further processing;
- with said first masking layer in place, performing a first etching process on said layer of spacer material to form sidewall spacers positioned proximate said second gate stack;
- after forming said sidewall spacers, performing a second etching process to remove said second layer of hard mask material in said second gate stack, thereby exposing said first layer of hard mask material in said second gate stack;
- removing said first masking layer;
- forming an etch stop layer above said first gate stack, said second gate stack and said isolation gate stack;
- forming a second masking layer above said isolation gate stack and said second gate stack, said second masking layer exposing said first gate stack for further processing;
- with said second masking layer in place, performing at least one third etching process on said etch stop layer and on said layer of spacer material to form sidewall spacers positioned proximate said first gate stack, said at least one third etching process exposing said second layer of hard mask material in said first gate stack;
- performing a fourth etching process to remove said second layer of hard mask material in said first gate stack, thereby exposing said first layer of hard mask material in said first gate stack; after removing said second layer of hard mask material from above said first gate stack, removing said second masking layer;
- forming a polish stop layer between said plurality of gate stacks, an upper surface of said polish stop layer being positioned at a level that is above a level of an upper surface of said layer of gate electrode material in each of said gate stacks;
- performing at least one fifth etching process on said etch stop layer, said layer of spacer material, and said second layer of hard mask material positioned above or proximate said isolation gate stack, said at least one fifth etching process exposing said first layer of hard mask material in said isolation gate stack; and
- performing at least one chemical mechanical polishing process to remove material positioned above said upper surface of said polish stop layer.

14. The method of claim 13, further comprising removing said polish stop layer.

15. The method of claim 13, wherein said polish stop layer is comprised of a flowable oxide material.

16. The method of claim 13, wherein said first gate stack is a gate stack for an NMOS transistor and said second gate stack is a gate stack for a PMOS transistor.

17. The method of claim 13, wherein said first gate stack is a gate stack for a PMOS transistor and said second gate stack is a gate stack for an NMOS transistor.

18. The method of claim 13, wherein said first and third layers of hard mask material are comprised of silicon nitride and said second layer of hard mask material is comprised of a carbon-based material.

* * * * *